United States Patent
Linow et al.

(10) Patent No.: US 9,248,425 B2
(45) Date of Patent: Feb. 2, 2016

(54) APPARATUS FOR IRRADIATING A SUBSTRATE

(71) Applicant: Heraeus Noblelight GmbH, Hanau (DE)

(72) Inventors: Sven Linow, Darmstadt (DE); Larisa von Riewel, Mainaschaff (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 14/388,021

(22) PCT Filed: Jan. 18, 2013

(86) PCT No.: PCT/EP2013/000149
§ 371 (c)(1),
(2) Date: Sep. 25, 2014

(87) PCT Pub. No.: WO2013/143633
PCT Pub. Date: Oct. 3, 2013

(65) Prior Publication Data
US 2015/0048261 A1   Feb. 19, 2015

(30) Foreign Application Priority Data

Mar. 26, 2012   (DE) .......................... 10 2012 005 916

(51) Int. Cl.
*G21K 5/00*   (2006.01)
*B01J 19/12*   (2006.01)
(Continued)

(52) U.S. Cl.
CPC ............... *B01J 19/128* (2013.01); *B05D 3/06* (2013.01); *H01L 21/67115* (2013.01)

(58) Field of Classification Search
USPC ................ 250/492.1, 492.2, 492.21, 492.22, 250/492.23, 493.1
See application file for complete search history.

(56) References Cited

U.S. PATENT DOCUMENTS

| 4,859,832 A | 8/1989 | Uehara et al. |
| 5,930,456 A | 7/1999 | Vosen |

(Continued)

FOREIGN PATENT DOCUMENTS

| DE | 3617918 A1 | 12/1987 |
| DE | 10051125 A1 | 5/2002 |

(Continued)

OTHER PUBLICATIONS

Int'l Search Report and Written Opinion issued May 2, 2013 in Int'l Application No. PCT/EP2013/000149.

(Continued)

*Primary Examiner* — Nicole Ippolito
(74) *Attorney, Agent, or Firm* — Panitch Schwarze Belisario & Nadel LLP

(57) ABSTRACT

Known apparatuses for irradiating a substrate include a receptacle for the substrate to be irradiated having a circular irradiation surface and a first optical emitter having at least one emitter tube arranged in an illumination plane extending parallel to the irradiation surface. The illumination length of the emitter tube includes a middle section and two end sections, the length of the middle section accounting for at least 50% of the illumination length. The receptacle and the optical emitter are movable relative to each other. An apparatus for thermal treatment of a substrate, enabling ho-mogeneous and/or rotationally symmetrical heating of the substrate and requiring less complexity in its design and control technology, includes a middle section of the emitter tube having a steadily decreasing curvature, provided that the illumination length of the emitter tube extends over an angle of curvature of less than $2\pi$.

17 Claims, 6 Drawing Sheets

(51) Int. Cl.
*H01L 21/67* (2006.01)
*B05D 3/06* (2006.01)

(56) References Cited

U.S. PATENT DOCUMENTS

| | | |
|---|---|---|
| 6,108,490 A | 8/2000 | Lee et al. |
| 6,759,805 B2 | 7/2004 | de Cort et al. |
| 7,327,948 B1 | 2/2008 | Shrinivasan et al. |
| 2004/0089649 A1 | 5/2004 | Falter |
| 2005/0217799 A1* | 10/2005 | O'Meara et al. .. H01L 21/67109 156/345.52 |
| 2009/0101633 A1 | 4/2009 | Aggarwal et al. |
| 2011/0007405 A1 | 1/2011 | Sakai |

FOREIGN PATENT DOCUMENTS

| | | |
|---|---|---|
| EP | 1120997 A1 | 8/2001 |
| EP | 1962323 A1 | 8/2008 |

OTHER PUBLICATIONS

Office Action issued Nov. 19, 2012 in DE Application No. 10 2012 005 916.7.

* cited by examiner

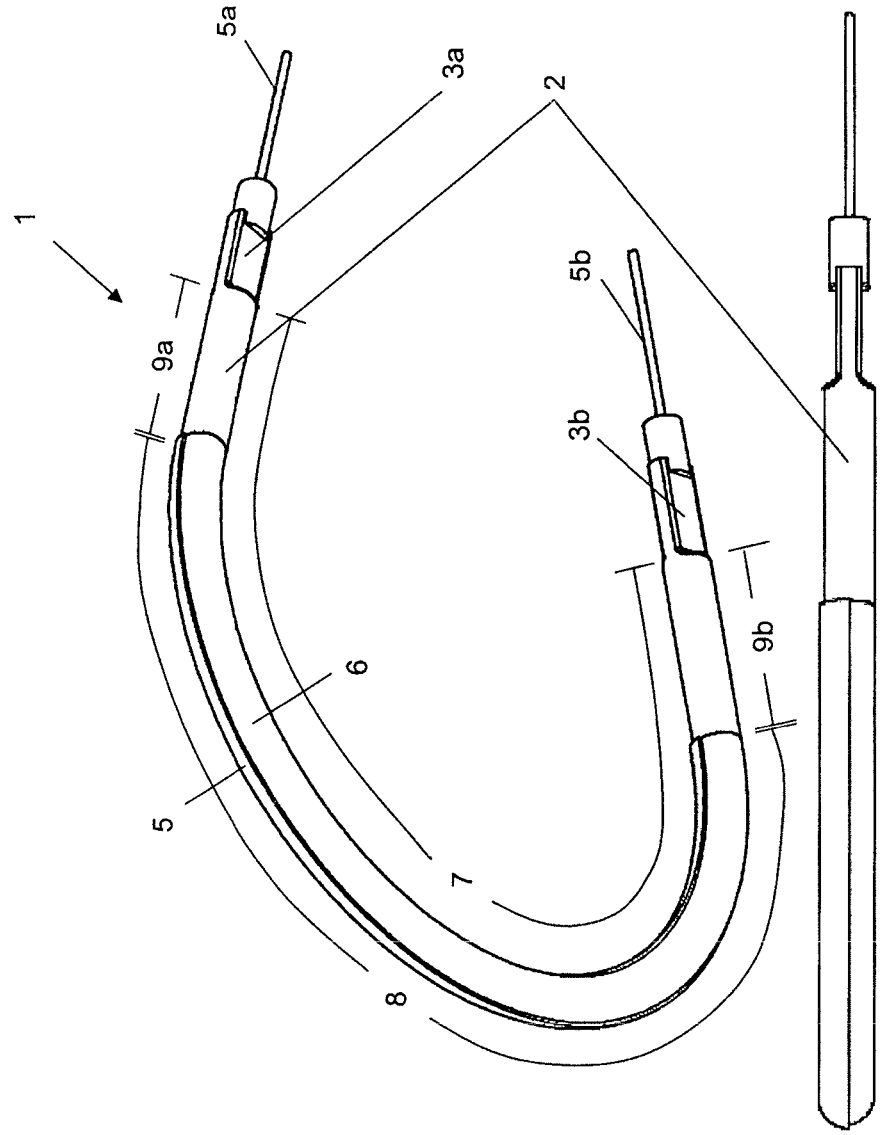

APPARATUS FOR IRRADIATING A SUBSTRATE

CROSS-REFERENCE TO RELATED APPLICATIONS

This application is a Section 371 of International Application No. PCT/EP2013/000149, filed Jan. 18, 2013, which was published in the German language on Oct. 3, 2013, under International Publication No. WO 2013/143633 A1 and the disclosure of which is incorporated herein by reference.

BACKGROUND OF THE INVENTION

The present invention relates to an apparatus for irradiating a substrate, the apparatus comprising a receptacle for the substrate to be irradiated, the substrate having a circular irradiation surface, and an optical emitter having at least one emitter tube. The emitter tube comprises an illumination length having a middle section and two end sections and is arranged in an illumination plane that extends parallel to the irradiation surface, wherein the length of the middle section accounts for at least 50% of the illumination length. The receptacle and the optical emitter can be moved with respect to each other.

The present invention further relates to a use of the apparatus according to the invention for irradiating a substrate.

Such devices are used, for example, for drying of paints and lacquers, for curing coatings, for heating food products or for the processing of semiconductor wafers.

Known apparatuses for irradiating a substrate comprise a process chamber for accommodation of a substrate to be irradiated and at least one optical emitter, which is often designed in the form of an infrared emitter. Usually, a uniform irradiation of the substrate surface and a homogeneous temperature distribution inside the substrate are important for the process result.

An irradiation apparatus of the aforementioned type is known from German published patent application DE 100 51 125 A1, which discloses a rapid heating system for semiconductor wafers. The rapid heating system has a rotatably mounted holder for a substrate having a circular irradiation surface and multiple infrared emitters having a linear, cylindrical-elongated emitter tube made of quartz glass and a filament made of tungsten, whose ends are provided with electrical connection elements for the supply of electrical power via power supply wires. To ensure homogeneous irradiation of the substrate on all sides, the infrared emitters are arranged in two irradiation planes, namely above and below the irradiation surface. The infrared emitters in the irradiation planes are mounted next to each other in parallel and, taken together, form a two-dimensional emitter.

Due to the two-dimensional array of infrared emitters, a plurality of infrared emitters are provided in the irradiation apparatus with respect to the surface to be irradiated. The irradiation apparatus also has very high radiated power per unit area. To achieve a homogeneous distribution of the heating power, the heating power of the infrared emitters must therefore be coordinated. This applies especially to the edges of the irradiation surface. An irradiation apparatus having a two-dimensional array of infrared emitters therefore necessitates a complex control technology.

Moreover, a two-dimensional array of infrared emitters of this type having a linear, elongated emitter tube is disadvantageous from the point of view of design. This is particularly the case when the space available for positioning the infrared emitters is limited, confined or difficult to access.

BRIEF SUMMARY OF THE INVENTION

The invention is therefore based on the object to devise an apparatus for irradiating a substrate, which enables homogeneous and/or rotationally symmetrical irradiation of the substrate, and also requires less complexity in terms of its design and control technology.

The invention is also based on the object to specify a suitable use for the apparatus according to the invention.

Referring to the device, the object is solved, according to the invention, based on an apparatus for irradiating a substrate of the afore-mentioned type in that the middle section of the emitter tube has a steadily decreasing curvature, provided that the illumination length of the emitter tube extends over an angle of curvature of less than $2\pi$.

Preferably, the middle section of the emitter tube has the curvature of an arithmetic spiral.

The irradiation apparatus comprises a receptacle for a substrate to be irradiated and an optical emitter, which are arranged movable with respect to each other. For example, the receptacle and/or the optical emitter are mounted rotatably about a rotation axis, so that the emitter irradiates a circular irradiation surface having a radius r.

For illustration of the invention, first, an apparatus is considered which has only a single optical emitter that extends in a radial direction of the irradiation surface and has a constant radiated power. The receptacle and the emitter being movable with respect to each other attains a homogeneous irradiation of the points of the substrate that are situated on a common circular path. However, since the emitter passes over an increasingly longer circular path with increasing radial distance from the center of the circular surface in the same time interval, the substrate surface is exposed to decreasing radiation intensities the larger the radius of the circular paths.

According to the prior art, these radially different irradiation intensities are avoided in that multiple optical emitters are arranged in parallel next to each other, so that a two-dimensional emitter encompassing the entire irradiation surface is obtained. This solution requires a large number of emitters and is complex in terms of both design and control technology.

In contrast, a higher irradiation intensity with increasing radial distance from the center of the irradiation surface is attained with the apparatus according to the invention, in that the emitter comprises a curved emitter tube that comprises a continuously decreasing curvature at least in the middle section, preferably the curvature of an arithmetic spiral. This curvature of the emitter tube allows, with increasing radial distance, for an increase of the effective emitter length section with respect to the partial surface to be irradiated, such that a homogeneous irradiation of the substrate can be achieved over the entire irradiation area.

Optical emitters in the scope of the invention are, for example, infrared emitters or emitters emitting visible or ultraviolet (UV) radiation. The optical emitter according to the invention comprises an illumination length having a middle section and two end sections. The end sections can be, for example, an extension of the curved middle section, or can be adapted to the design of the apparatus or to the substrate to be irradiated. In any case, the overall illumination length of the one optical emitter is at least as large as the radius of the irradiation surface. On the other hand, the illumination length of the infrared emitter according to the invention passes over an arc of curvature of less than $2\pi$ rad (360°), such that the device according to the invention can be particularly compact in design. The apparatus can comprise one or more emitters.

An advantageous embodiment of the apparatus according to the invention provides the circular irradiation surface to comprise a center that determines the pole of a planar polar coordinate system that comprises coordinate lines in the form of concentric circles to define the angle φ and ray axes to define the radius r of a coordinate in the polar coordinate system and provides the curvature of the middle section of the emitter tube to be given by the coordinates according to the following mathematical function:

$$r=k*\phi \text{ and } \phi<2\pi \text{ rad,}$$

wherein k is a constant factor.

A planar polar coordinate system is defined by one fixed point, namely the pole, and one axis selected to be fixed, the polar axis. The pole is also referred to as the origin of coordinates. The polar coordinate system is defined by coordinate lines extending as concentric circles around the pole and by rays extending radially outwardly from the pole.

In the apparatus according to the invention, the pole of the planar polar coordinate system plane is defined by the center M of the circular irradiation surface. In addition, a polar axis is defined, which has its origin in the pole and on which the radius r of the irradiation surface is plotted. Such a polar coordinate system is shown schematically in FIG. 8. A coordinate P in the plane defined by the polar coordinate system is defined by polar coordinates P (φ, r), i.e. it is defined by the angle φ and the radius r.

For illustration, the circular polar coordinate system shall be presumed to comprise coordinate lines extending about the pole M at a distance Δr and n ray-like coordinate lines that divide the plane into n partial angles Δφ, wherein Δφ=2π/n. The plane of the polar coordinate system is sub-divided by the coordinate lines into partial surfaces ($T_1$, $T_2$, $T_3$, ...), whose surface areas depend on their radial distance from the pole. The partial surfaces thus formed comprise two linear and at least one curved side line(s). All partial surfaces share, first, that the two linear sides have a length of Δr, and second, that the angle at which the two straight lines extending through the two linear side lines intersect in the center line is Δφ for all partial surfaces.

In a radiation apparatus having an elongate, radially extending infrared emitter that has constant irradiation power along its emitter tube, a constant energy per unit of emitter length and unit of time is released along the emitter tube. Since the sizes of the irradiation surfaces increase in a radial direction, a decreasing irradiation intensity impinges on the substrate surface with increasing radial distance from the center.

To ensure that the radiation intensity is homogeneous, the invention provides the input of energy by the optical emitter into the corresponding partial surfaces to be increased as a function of the distance from the pole. The increase in the energy input is effected by extending the emitter length section that effectively acts on the partial surface. This is achieved by the curvature of the emitter tube decreasing toward the outside.

As shown in FIG. 9, the curvature of the emitter tube, allowing for a maximal attainable effective length emitter length section, can be defined in approximation by a polygon chain composed of a finite number of straight lines. Accordingly, a maximal effective emitter length section is obtained, when the straight lines of the polygon chain connect, for example the points $P_1$ ($a_i*\Delta\phi$, $a_2*\Delta r$) and $P_2$ (($a_1$+1)*Δφ, ($a_2$+1)*Δr), wherein $a_1$ and $a_2$ are natural numbers. The higher the number n of the sub-division, the more closely the polygon chain approximates the arc length of an arithmetic spiral.

Therefore, such an optimal curvature of the middle section of the emitter tube, which results in large effective emitter length sections, can be defined by the coordinates according to the following mathematical function:

$$r=k*\phi \text{ and } \phi<2\pi \text{ rad,}$$

wherein k is a constant factor.

In an alternative and equally advantageous embodiment of the apparatus according to the invention, the invention provides the circular irradiation surface to comprise a center that defines the pole of a planar polar coordinate system that comprises coordinate lines in the form of concentric circles to define the angle φ and comprises ray axes to define the radius r of a coordinate in the polar coordinate system, and provides the middle section of the emitter tube to comprise a first part-length, in which the curvature of the emitter tube is described by the coordinates according to the mathematical function:

$$r=k_1*\phi \text{ and } \phi<2\pi \text{ rad,}$$

and comprises a second part-length, in which the curvature of the emitter tube is defined by the co-ordinates according to the mathematical function:

$$r=k_2*\phi \text{ and } \phi<2\pi \text{ rad,}$$

wherein $k_1$ and $k_2$ are constant factors and $k_1 \neq k_2$.

Regarding the polar coordinate system, please refer to the explanation above and FIGS. 8 and 9.

Varying the slope k has a significant influence on the intensity distribution on the surface to be irradiated.

An optical emitter having an emitter tube that comprises a first part-length and a second part-length having different curvatures of a spiral, which each decrease in a radial outward direction, allows for flexible adjustment of the irradiation intensity in a radial direction. This applies, in particular, to optical emitters having long emitter tubes. Since the two part-lengths of the emitter tube differ in their curvature, it is possible to adjust the energy input to the respective part-surfaces to be irradiated. This type of adjustment is required, for example, when the irradiation intensity is to be adjusted to the shape of the substrate and a radial irradiation intensity gradient is to be established. The change in the irradiation intensity can be stepwise or continuous.

In a further, likewise preferred, embodiment of the apparatus according to the invention, the invention provides the curvature of the emitter tube to be described by a curve passing through the centers of the cross-sectional surfaces of the emitter tube, wherein the curve deviates at no position by more than 1 mm, preferably by no more than 0.3 mm, from the curvature defined by the mathematical function.

The use of optical emitters having a curved emitter tube in irradiation apparatuses that are suitable for homogeneous irradiation of substrates requires the manufacturing of the curved emitter tubes to be accurate and reproducible. The curvature of the emitter tube can be defined by a curve passing through the centers of the cross-sectional surfaces. This curve deviates at no position by more than 1 mm, preferably by no more than 0.3 mm, from the curvature of the emitter tube defined by the afore-mentioned ideal mathematical function. If the requirements are strict, deviations from the ideal shape of more than 1 mm can already jeopardize a homogeneous irradiation distribution and thus a homogeneous irradiation of the substrate. The emitter tubes are made by machine or by hand. In the production by hand, the emitter tube is adapted, for example to callipers made of graphite, whereby a high accuracy of the emitter tube shape is achieved.

It has proven expedient that the illumination length of the emitter tube extends over an angle of curvature of less than π rad.

To ensure the illumination intensity on the irradiation surface to be homogeneous, the curvatures of the emitters used here need to be manufactured at high precision. An emitter having an emitter tube which extends through an angle of curvature of less than π rad, is simple and inexpensive to manufacture at high precision.

In a preferred modification of the apparatus according to the invention, the apparatus includes only a single curved optical emitter.

An irradiation apparatus having a single curved optical emitter is particularly inexpensive to manufacture and is easy to control. Moreover, a single emitter takes up little space. It can be installed even in hard-to-reach confined places of the irradiation device and can be used, in particular, in irradiation apparatuses, in which space constraints render the installation, for example, of a two-dimensional emitter difficult. Such space constraints may be, for example, posed by gas supply lines, brackets, axles, or motors, which can be provided both in the central area and at the peripheral region of the apparatus.

When using only a single emitter, some cooling proceeds between each irradiation cycle due to the relative motion of emitter and irradiation surface. The cool-down phase can be reduced by increasing the rotation speed. But there are limits.

Therefore, the apparatus according to the invention comprises, in another likewise preferred modification, at least one further optical emitter having a curved emitter tube that extends in an illumination plane parallel to the irradiation surface and has an illumination length comprising a middle section and two end sections, wherein the length of the middle section accounts for at least 50%, preferably at least 90% of the illumination length.

An irradiation apparatus having at least two curved optical emitters allows for short cool-down phases and, concurrently, for particularly homogeneous irradiation of the substrate at high irradiation intensities. The emitters can have the same or different design(s). They can also differ, for example, in the length of the filaments, the filament material or the applied voltage. The emitter power and the curvature of the emitter tube are preferably matched to the substrate to be irradiated.

It has proven to be expedient that the first optical emitter irradiates an internal irradiation surface, as seen in a radial direction, and the at least one further optical emitter irradiates an external irradiation surface, as seen in a radial direction, wherein the internal and external irradiation surfaces overlap at least partially. According to the invention, the apparatus comprises at least two optical emitters, which each irradiate at least one part-surface of the substrate. In the simplest case, the irradiation apparatus comprises a first optical emitter for irradiating a first, internal irradiation surface, and a second optical emitter for irradiating a second, external irradiation surface of the substrate. As the irradiation power impinging on the substrate decreases especially in the peripheral regions of the optical emitters due to geometrical effects, these edge effects might impair homogeneous irradiation of the substrate. Therefore, to minimize the influence of peripheral regions of the emitters on the irradiation power, the emitters are arranged appropriately such that their irradiation surfaces overlap at least partially—as viewed in a radial direction.

It has proven to be expedient that the irradiation surface comprise a center and that a ray axis originate in the center and extend radially outward and intersect the first and the at least one further emitter.

Due to the relative motion of the emitter and the irradiation surface, there is a radiation-free time interval between each irradiation cycle. In order to ensure homogeneous irradiation of the substrate in the radial direction originating from the center, the first and the at least one further emitter are arranged appropriately, such that a ray axis originating from the center and extending radially outward intersects both the first and the further emitter. As a result, two adjacent irradiation zones extending in a radial direction are formed.

It has proven expedient that the optical emitters, altogether, be arranged in the form of a spiral.

A spiral arrangement of the optical emitters enables homogeneous irradiation of the surface to be irradiated. In contrast to a single spiral-shaped emitter having a predetermined irradiation power, a plurality of emitters can be controlled separately from each other, whereby a higher total irradiation power is achieved. The arrangement is particularly well-suited for large substrates and for the attainment of high irradiation strengths.

An advantageous embodiment provides multiple independently controllable heating coils to be arranged in the curved emitter tube.

Having multiple independently controllable heating elements inside the emitter tube, allows each heating coil, and thus the irradiation intensity of an emitter length section to be influenced, for example, via the operating voltage. This is advantageous especially for irradiation of substrates that extend in three directions in space, such that the irradiation intensity impinging on the irradiation surface can be adapted to the substrate shape.

It has proven advantageous that the end-sections also comprise the curvature of an arithmetic spiral.

In many irradiation apparatuses, only limited space is available for arrangement of the emitter, especially in the central region or in the peripheral region of the irradiation device, such that the end sections of the emitter need to be adapted to the available space. However, if sufficient space is available, it has proven advantageous that the end sections also comprise the curvature of an arithmetic spiral. The end sections are particularly well-suited for homogeneous irradiation of the substrate. The curvature of the end sections is identical to, or deviates from, the curvature of the central section.

It has proven expedient that the length of the middle section of the first optical emitter accounts for at least 90% of the illumination length.

An optical emitter having a middle section of this length extends over a large angular range and is therefore particularly well-suited for homogeneous irradiation of a substrate.

The apparatus according to the invention having an optical emitter in the form of an infrared emitter is especially well-suited for the processing of semiconductor wafers. In the processing of a semiconductor wafer, it is often crucial to heat the semiconductor wafer particularly homogeneously.

Furthermore, the apparatus according to the invention having an optical emitter in the form of a gas discharge emitter for the curing of coatings can be used advantageously on optical storage media, or semiconductor wafers, wherein a gas discharge emitter of this type preferably emits either UV radiation and short wavelength visible radiation for accelerating or triggering chemical curing reactions, or it emits visible or even near infrared radiation to perform such processes, which are preferably controlled or triggered in this wavelength range. Preferably, argon, krypton or xenon can be used as the filling gas.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 6 is top perspective and side schematic views of a curved infrared emitter according to an embodiment of the invention having an emitter tube, whose middle section has the curvature of an arithmetic spiral;

DETAILED DESCRIPTION OF THE INVENTION

Figure 1:
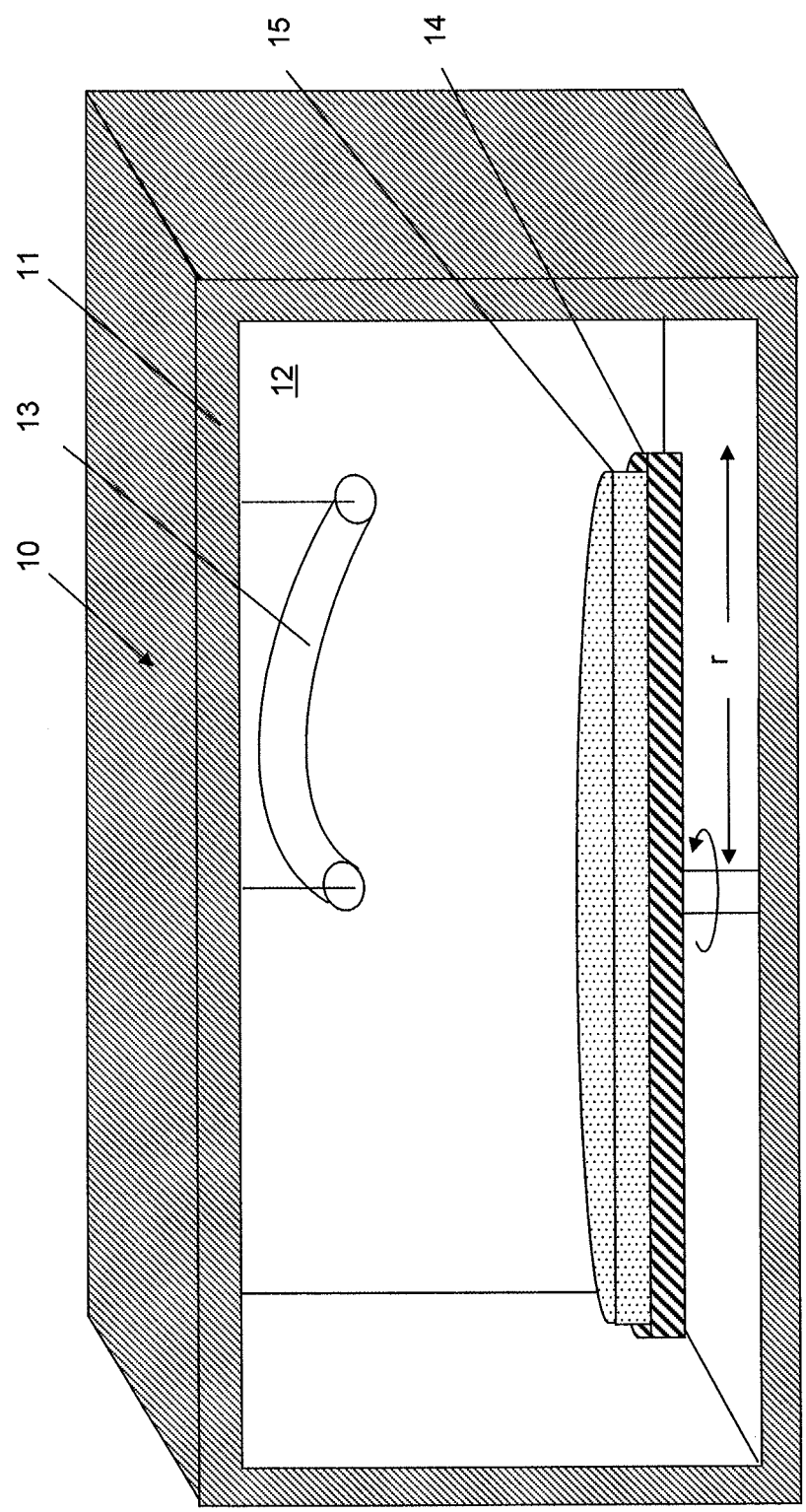
FIG. 1 is cross-sectional, schematic, perspective view of a first embodiment of an apparatus according to the invention having a curved infrared emitter for thermal treatment of a substrate.

FIG. 1 schematically shows a cross-section of an irradiation apparatus according to an embodiment of the invention for the processing of semiconductor wafers, which as a whole has reference number 10 assigned to it. The apparatus 10 consists of a housing 11 that encloses a process space 12, an infrared emitter 13, and a receptacle 14 for a substrate 15. The receptacle 14 is arranged within the process chamber such as to be rotatable. It serves for accommodation of the substrate 15 to be irradiated. Due to the receptacle 14 being rotatable, the receptacle 14 and the infrared emitter 13 can be moved with respect to each other such that the infrared emitter 13 irradiates a circular irradiation surface that has a radius r. The infrared emitter 13 is arranged in an illumination plane that extends parallel to the irradiation surface. The emitter tube of the infrared emitter 13 is curved and comprises the curvature of an arithmetic spiral. If the curvature of the emitter tube is defined by a curve that extends through the centers of the cross-sectional surfaces of the emitter tube, the curve deviates in no position by more than 0.3 mm from the curvature defined by the mathematical function.

Figure 2:
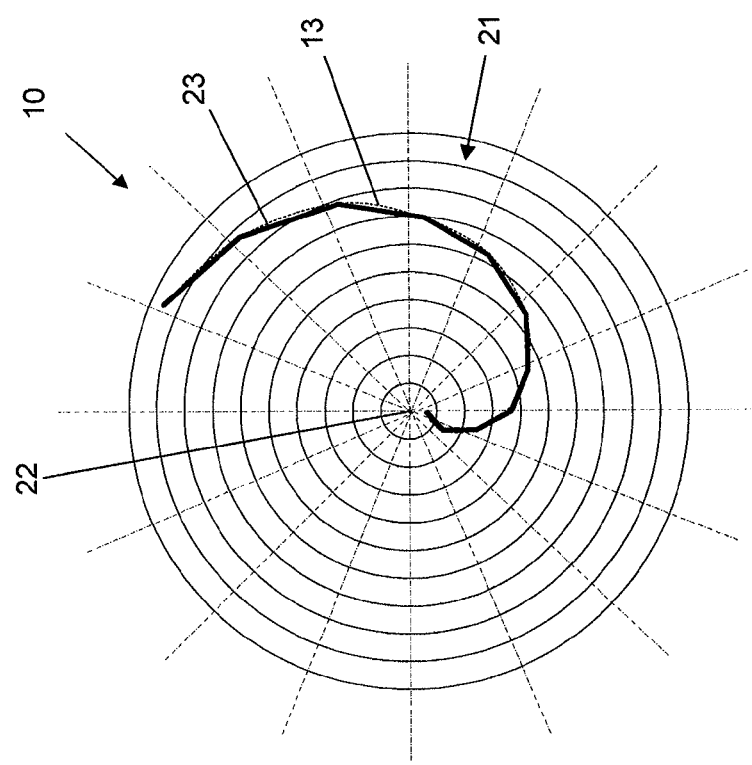
FIG. 2 is a top, schematic view of the first embodiment of the apparatus according to the invention having a curved infrared emitter for thermal treatment of a substrate.

FIG. 2 schematically shows a top view of the apparatus 10 according to the invention for irradiating a substrate. The apparatus 10 comprises a circular irradiation surface 21 having a center 22. An infrared emitter 13 is arranged in an illumination plane that extends parallel to the irradiation surface. The emitter tube of the infrared emitter 13 is made of quartz glass and comprises, over the entire illumination length, the curvature of an arithmetic spiral. Starting from the center 22 of the irradiation surface 21, the course of the curvature is shown approximately by a polygon chain 23, and the actual course of the infrared emitter 13 is also shown.

The radius of the irradiation surface is 150 mm. The infrared emitter is characterized by a nominal power of 2,000 W at a nominal voltage of 230 V, and an illumination length of 344 mm. The external dimensions of the emitter tube are 14×14 mm. The curvature of the emitter tube can be defined by the mathematical formula: $r=120$ mm$/\pi * \phi = 38.2$ mm$*\phi$. The illumination length of the emitter tube comprises an arc length of $10/8\pi$ rad=3.93 rad.

Figure 3:
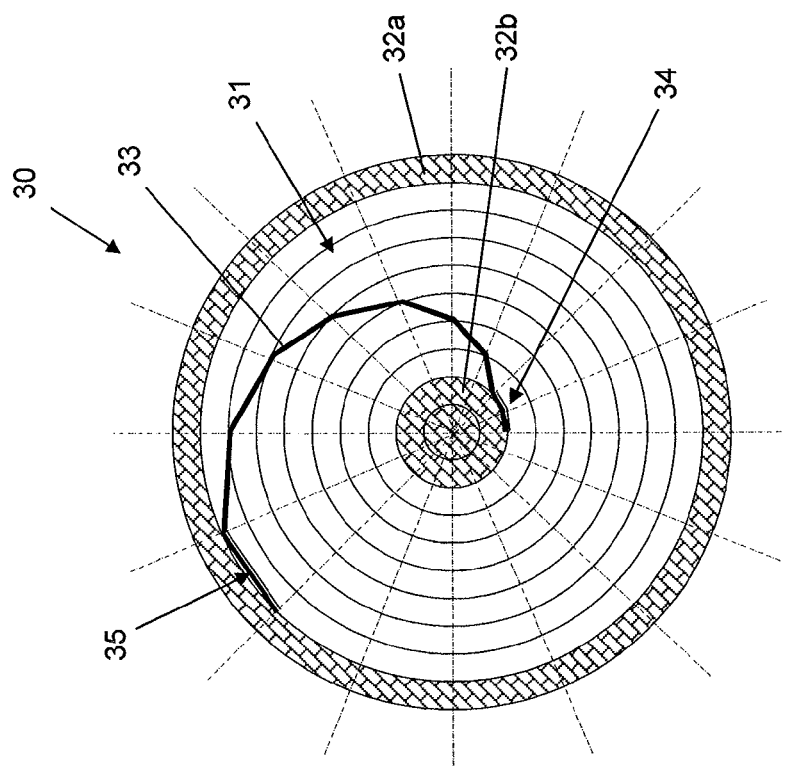
FIG. 3 is a top, schematic view of a second embodiment of an irradiation apparatus according to the invention having a curved infrared emitter, whose end-sections have a curvature that deviates from the ideal spiral shape.

The schematic top view of an irradiation apparatus 30 according to an embodiment of the invention, for curing coatings on optical storage media or semiconductor wafers, shown in FIG. 3 comprises an irradiation surface 31, in which no space for IR emitters is available in a peripheral region 32a and in a central region 32b due to space limitations by brackets, axles, and engines. These areas are shown hatched in FIG. 3. The curvature of the IR emitter 33 is shown simplified as a polygon chain. To ensure adequate and homogeneous irradiation of the peripheral region 32a and central region 32b, the shape of the end sections 34, 35 of the IR emitter 33 deviates from the shape of an arithmetic spiral. In the central section of the illumination length, the shape of an arithmetic spiral is maintained. The illumination length of the emitter tube comprises an arc length of $10/8\pi$ rad=3.93 rad.

The illumination length of the emitter tube is 330 mm. The middle section of the illumination length has a length of 253 mm, the end section 35 has a length of 53 mm, and the central end section 34 has a length of 23.6 mm. The radius of the irradiation surface is 135 mm. The infrared emitter 33 is characterized by a nominal power of 2,000 W at a nominal voltage of 230 V. The external dimensions of the emitter tube are 10×10 mm.

Figure 4:
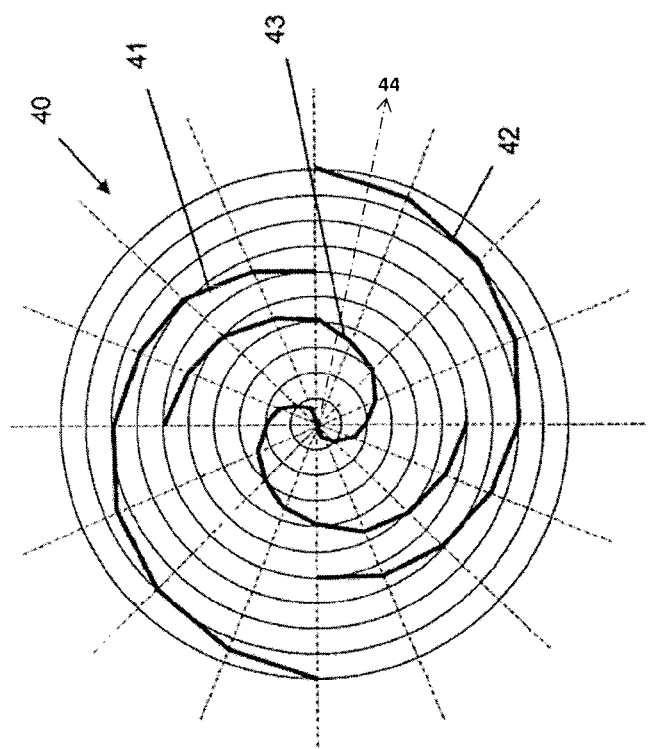
FIG. 4 is a top, schematic view of a third embodiment of an irradiation apparatus according to the invention having three curved infrared emitters.

FIG. 4 schematically shows a top view of the apparatus 40 according to an embodiment of the invention comprising three curved infrared emitters 41, 42, 43 for thermal treatment of a substrate. The infrared emitters 41, 42, 43 are arranged in the form of a spiral. Both the infrared emitters 41 and 43 and the infrared emitters 42 and 43 overlap each other in their end sections.

The infrared emitters 41, 42, 43 each irradiate a circular or annular irradiation surface. For exemplary purposes, a ray axis 44, which extends from the center of the irradiation surface outwards, is drawn in the figure and intersects both the emitter 43 and the emitter 41. In an alternative embodiment, the invention provides the internal emitter 43 to irradiate an internal irradiation surface and the external emitter 43 to irradiate an external irradiation surface, wherein the internal and external irradiation surfaces overlap as seen in radial direction.

The radius of the irradiation surface is 150 mm. The infrared emitters 41 and 42 are characterized by a nominal power of 1,910 W at a nominal voltage of 230 V, and an illumination length of 382 mm. The external dimensions of the emitter tube are 10×10 mm. The infrared emitter 43 has an illumination length of 476 mm. It has a nominal power of 2,380 W at a nominal voltage of 230 V. The curvature of the emitter tube of the infrared emitters 41, 42, 43 is given by the formula: $r=19.1$ mm$*\phi$.

Figure 5:
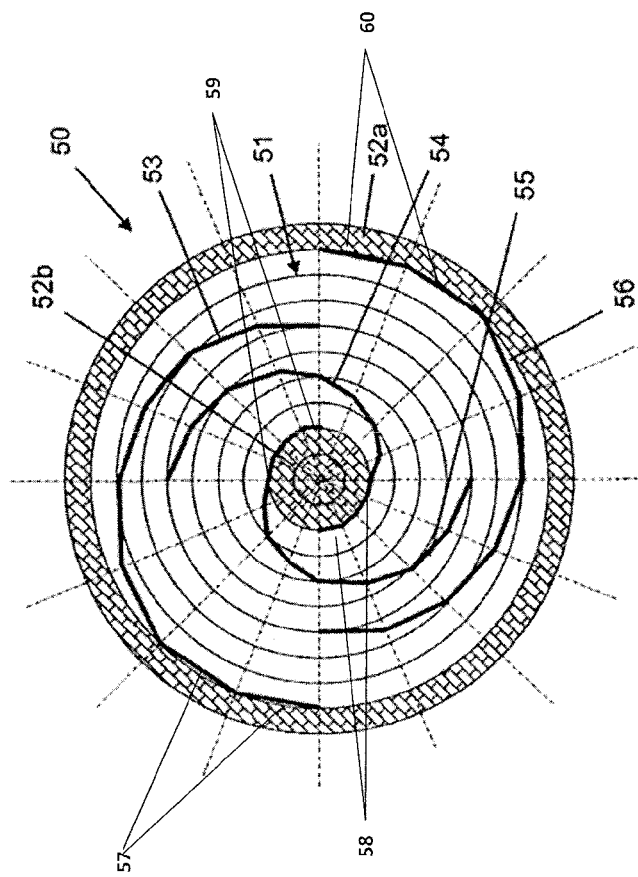
FIG. 5 is a top view, schematic view of a fourth embodiment of an irradiation apparatus according to the invention having four curved infrared emitters, whose end-sections have a curvature that deviates from the ideal spiral shape.

FIG. 5 shows an irradiation apparatus 50 according to the invention having four infrared emitters 53, 54, 55, 56. The apparatus 50 comprises a circular irradiation surface 51, in which no space is available for infrared emitters in a peripheral region 52a and a central region 52b due to space limitations by brackets, axles, and engines. These areas are shown hatched in FIG. 5. In order too nevertheless provide for sufficient and homogeneous irradiation of these areas 52a, 52b, the shape of the infrared emitters 53, 54, 55, 56 deviates, in an end section 57, 58, 59, 60 of the illumination length in each case, from the shape of an arithmetic spiral. In the middle section and the corresponding end section of the illumination length of each emitter, the shape of an arithmetic spiral is maintained.

The radius of the illumination surface is 135 mm. The infrared emitters 53 and 56 are characterized by a nominal power of 1,875 W at a nominal voltage of 230 V, and an illumination length of 375 mm. The external dimensions of the emitter tube are 10×10 mm. The infrared emitters 54, 55 have an illumination length of 246 mm and a nominal power of 1,230 W at a nominal voltage of 230 V. The curvature in the middle section of the emitter tubes of the infrared emitters 53, 54, 55, 56 can be defined by the mathematical formula: r=19.1 mm*φ, wherein the illumination length of the infrared emitters 53, 56 has an arc length of π rad and the illumination length of the infrared emitters 54, 55 has an arc length of 3/2π rad.

FIG. 6 shows a schematic perspective view and a side view of an infrared emitter according to the invention, which as a whole has reference number 1 assigned to it. The infrared emitter 1 comprises a curved emitter tube 2 made of quartz glass, a heating element in the form of a coil made of tungsten (not shown), and two gas-tight seals 3a, 3b in the form of "pinchings" of the emitter tube 2, through which the power supply leads 5a, 5b are guided into the emitter tube 2.

The power supply consists of an external and an internal power supply wire and a molybdenum foil. The internal power supply wire protrudes into the emitter tube and is used for electrical contacting of the heating element.

The emitter tube 2 comprises an illumination length 7 that consists of a middle portion 8 and two end sections 9a, 9b. The length of the middle section 8 accounts for 90% of the total illumination length 7. In the middle section 8, the emitter tube has the curvature of an arithmetic spiral. The illumination length 7 of the emitter tube 2 comprises an arc length of 1.1π rad. A reflector 5 is applied to the surface of the emitter tube 2 in the form of a gold coating, such that the radiation generated by the filament exits from the area 6 of the emitter tube 2.

The infrared emitter 1 is characterized by a nominal power of 1,000 W at a nominal voltage of 230 V, and an illumination length 7 of 400 mm. The external dimensions of the emitter tube 2 are 10×10 mm.

Figure 7:
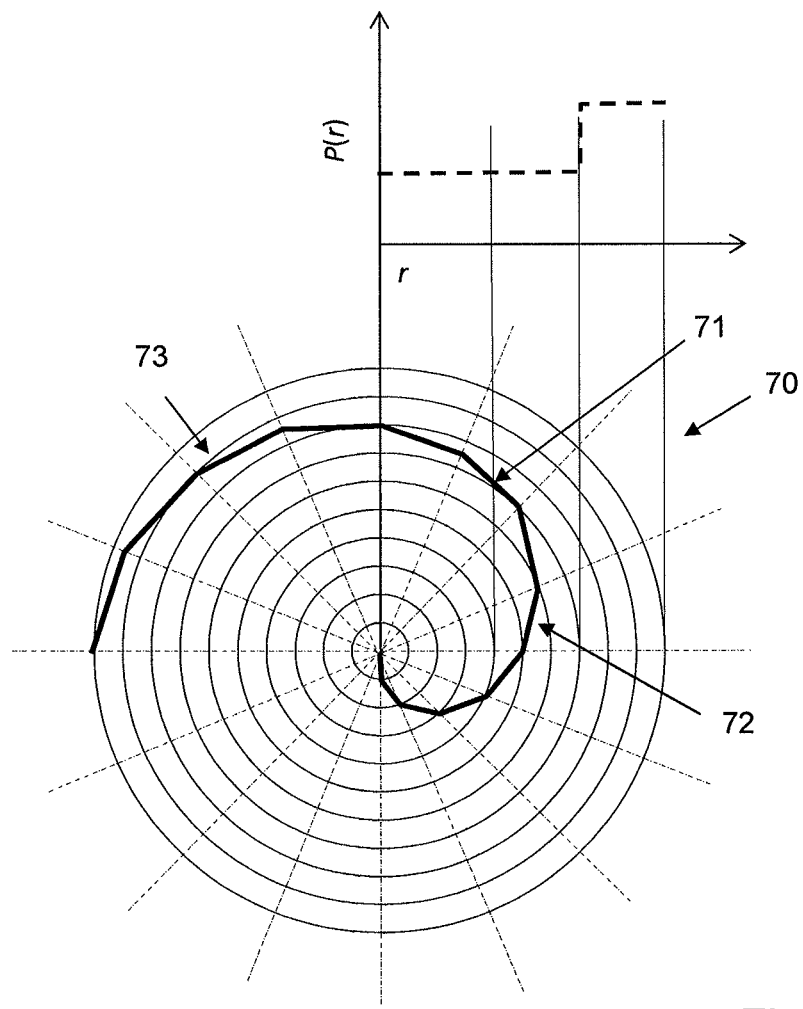
FIG. 7 is a top schematic view of a fifth embodiment of an irradiation apparatus according to the invention, in which the infrared emitter comprises an emitter tube having a first part-length with the curvature of a first arithmetic spiral and a second part-length with the curvature of a second arithmetic spiral.
Figure 9:
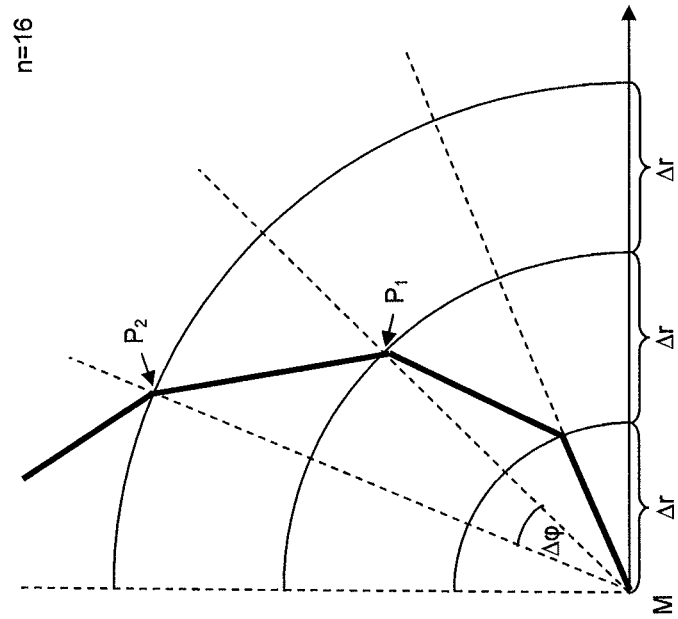
FIG. 9 is an enlarged detail view from a polar coordinate system for illustration of the invention.
Figure 8:
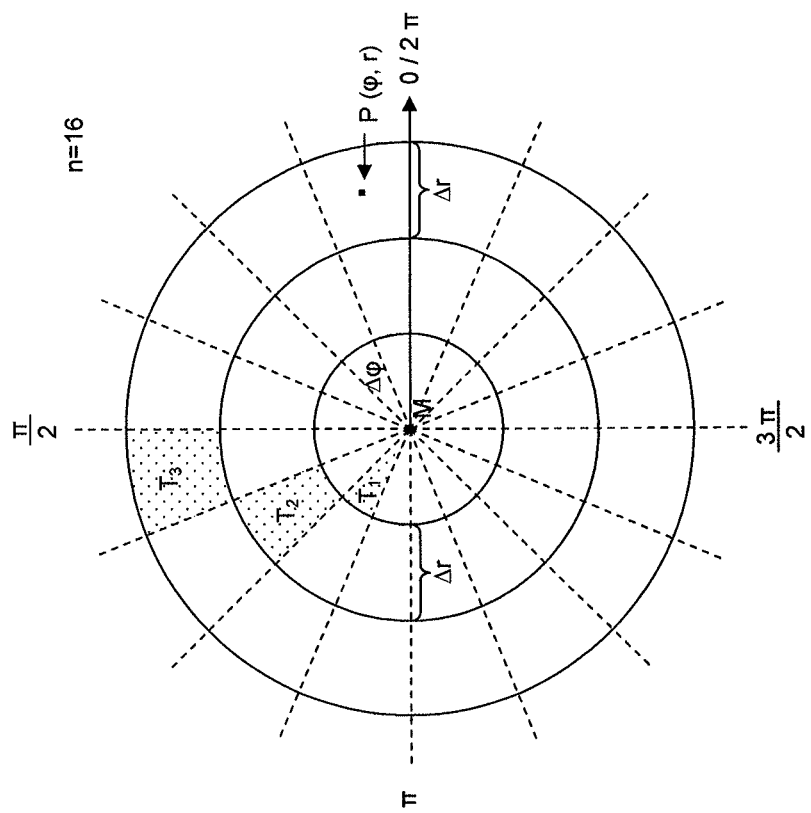
FIG. 8 is a plan view of a polar coordinate system for illustration of the invention.

FIG. 7 shows a top view of a fifth embodiment of the irradiation apparatus 70 according to the invention having a single infrared emitter 71. The curvature of the infrared emitter 71 is shown simplified as a polygon chain. The emitter tube of the infrared emitter 71 comprises a first part-length 72 having a large spiral pitch and a second part-length 73 having a reduced spiral pitch.

By means of the two different part-lengths of different spiral pitch, the irradiation power impinging on the irradiation surface can be gradually adjusted. FIG. 7 shows the power P(r) of the irradiation apparatus 70 schematically as a function of radius r. The plot shows that a higher irradiation power can be attained by decreasing spiral pitch.

The radius of the irradiation surface is 150 mm. The infrared emitters 71 are characterized by a nominal power of 2805 W at a nominal voltage of 400 V, and an illumination length of 467.5 mm. The external dimensions of the emitter tube are 10×10 mm. The curvature of the first part-length of the emitter tube is given by the mathematical formula: r=38.2 mm*φ, the curvature of the second part-length of the emitter tube is given by the mathematical relation: r=19.1 mm*φ. The illumination length of the emitter tube comprises an arc length of 13/8π rad.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An apparatus for irradiating a substrate, the apparatus comprising a receptacle for the substrate to be irradiated, the substrate having a circular irradiation surface, a first optical emitter having at least one emitter tube arranged in an illumination plane extending parallel to the irradiation surface, the at least one emitter tube comprising an illumination length having a middle section and two end sections, wherein the length of the middle section accounts for at least 50% of the illumination length, wherein the receptacle and the optical emitter are movable with respect to each other, and wherein the middle section comprises a curvature that continually decreases from one of the two end sections to the other of the two end sections, provided that the illumination length of the emitter tube extends over an angle of curvature of less than $2\pi$ it rad.

2. The apparatus according to claim 1, wherein the middle section comprises a curvature of an arithmetic spiral.

3. The apparatus according to claim 1, wherein the circular irradiation surface comprises a center defining a pole of a planar polar coordinate system comprising coordinate lines in a form of concentric circles to define an angle φ and comprising ray axes to define a radius r of a coordinate in the polar coordinate system and provides the curvature of the middle section to be described by coordinates according to the following mathematical function:

$r = k^* \phi$ and $\phi < 2\pi$ rad, wherein k is a constant factor.

4. The apparatus according to claim 3, wherein the curvature of the emitter tube is given by a curve passing through centers of cross-sectional surfaces of the emitter tube, wherein the curve deviates at no position by more than 1 mm from the curvature given by the mathematical function.

5. The apparatus according to claim 4, wherein the curve deviates at no position by more than 0.3 mm from the curvature given by the mathematical function.

6. The apparatus according to claim 1, wherein the circular irradiation surface comprises a center defining a pole of a planar polar coordinate system comprising coordinate lines in a form of concentric circles to define an angle φ and comprising ray axes to define a radius r of a coordinate in the polar coordinate system, and wherein the middle section comprises a first part-length, in which the curvature of the emitter tube is described by coordinates according to the mathematical function:

$r = k_1^* \phi$ and $\phi < 2\pi$ rad, and comprises a second part-length, in which the curvature of the emitter tube is defined by coordinates according to the mathematical function:

$r = k_2^* \phi$ and $\phi < 2\pi$ rad, wherein $k_1$ and $k_2$ are constant factors and $k_1 \neq k_2$.

7. The apparatus according to claim 1, wherein the illumination length of the emitter tube extends over an angle of curvature of less than π rad.

8. The apparatus according to claim 1, wherein the apparatus has just a single curved optical emitter.

9. The apparatus according to claim 1, wherein the apparatus comprises at least one additional optical emitter having a curved emitter tube extending in an illumination plane parallel to the irradiation surface and having an illumination length comprising a middle section and two end sections, wherein the length of the middle section of the at least one additional optical emitter accounts for at least 50% of the illumination length.

10. The apparatus according to claim 9, wherein the length of the middle section of the at least one additional optical emitter accounts for at least 90% of the illumination length.

11. The apparatus according to 9, wherein the first optical emitter irradiates an inner irradiation surface, as seen in a radial direction, and the at least one additional optical emitter irradiates an outer irradiation surface, as seen in a radial direction, and wherein the inner and outer irradiation surfaces overlap at least partially.

12. The apparatus according to claim 9, wherein the irradiation surface comprises a center and a ray axis originates in the center and extends radially outward and intersects the first and the at least one additional emitter.

13. The apparatus according to claim 9, wherein the optical emitters, altogether, are arranged in the shape of a spiral.

14. The apparatus according to claim 1, wherein the end sections also comprise a curvature of an arithmetic spiral.

15. The apparatus according to claim 1, wherein the length of the middle section of the first optical emitter accounts for at least 90% of the illumination length.

16. A method for processing of semiconductor wafers, the method comprising irradiating the semiconductor wafers using an apparatus according to claim 1, having an optical emitter in the form of an infrared emitter.

17. A method for the curing of coatings on optical storage media or semiconductor wafers, the method comprising irradiating the optical storage media or semiconductor wafers using an apparatus according to claim 1, having an optical emitter in the form of a gas discharge emitter.

* * * * *